(12) United States Patent
Pham et al.

(10) Patent No.: US 8,860,484 B2
(45) Date of Patent: Oct. 14, 2014

(54) FINE GRAIN DATA-BASED CLOCK GATING

(71) Applicant: Oracle International Corporation, Redwood City, CA (US)

(72) Inventors: Ha M Pham, San Jose, CA (US); Jin-uk Shin, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/838,212

(22) Filed: Mar. 15, 2013

(65) Prior Publication Data

US 2014/0266334 A1 Sep. 18, 2014

(51) Int. Cl.
*H03K 3/356* (2006.01)

(52) U.S. Cl.
USPC ............... 327/211; 327/212; 713/322

(58) Field of Classification Search
USPC ............... 327/211, 212; 713/322, 600
See application file for complete search history.

(56) References Cited

U.S. PATENT DOCUMENTS

| | | | |
|---|---|---|---|
| 5,498,988 A * | 3/1996 | Reyes et al. | 327/199 |
| 5,859,546 A * | 1/1999 | Yamauchi | 326/93 |
| 6,204,707 B1 * | 3/2001 | Hamada et al. | 327/202 |
| 6,456,115 B2 | 9/2002 | Li et al. | |
| 6,630,853 B1 * | 10/2003 | Hamada | 327/202 |
| 6,828,837 B2 * | 12/2004 | Ahn | 327/202 |
| 6,989,695 B2 * | 1/2006 | Dike et al. | 327/142 |
| 7,023,240 B2 * | 4/2006 | Elappuparackal | 326/40 |
| 7,076,682 B2 * | 7/2006 | Jacobson | 713/600 |
| 7,257,788 B2 | 8/2007 | Haar et al. | |
| 7,420,391 B2 * | 9/2008 | Pesci | 326/46 |
| 7,457,971 B2 * | 11/2008 | Pineda De Gyvez et al. | 713/300 |
| 7,639,046 B2 | 12/2009 | Gemmeke et al. | |
| 7,772,905 B2 * | 8/2010 | Yasuda et al. | 327/202 |
| 7,772,906 B2 * | 8/2010 | Naffziger | 327/203 |
| 8,195,975 B2 * | 6/2012 | Yamada et al. | 713/600 |
| 8,347,123 B2 * | 1/2013 | Schultz | 713/300 |
| 2003/0149905 A1 | 8/2003 | Santhanam et al. | |

* cited by examiner

*Primary Examiner* — Kenneth B. Wells
(74) *Attorney, Agent, or Firm* — Meyertons Hood Kivlin Kowert & Goetzel

(57) ABSTRACT

Embodiments of a logic path are disclosed that may allow for a reduction in switching power. The logic path may include a storage circuit, a comparison circuit, and a clock gating circuit. The storage circuit may be configured to store received data responsive to a local clock signal. The comparison circuit may be operable to compare the received data to data previously stored in the storage circuit. The clock gating circuit may be configured to generate the local clock signal dependent on a global clock signal, and de-activate the local clock signal dependent upon the results of the comparison performed by the comparison circuit.

17 Claims, 9 Drawing Sheets

FINE GRAIN DATA-BASED CLOCK GATING

BACKGROUND

1. Technical Field

This invention relates to integrated circuits, and more particularly, to techniques for implement storage elements within integrated circuits.

2. Description of the Related Art

Processors, and other types of integrated circuits, typically include a number of logic circuits composed of interconnected transistors fabricated on a semiconductor substrate. Such logic circuits may be constructed according to a number of different circuit design styles. For example, combinatorial logic may be implemented via a collection of un-clocked static complementary metal-oxide semiconductor (CMOS) gates situated between clocked state elements such as flip-flops or latches. Alternatively, depending on design requirements, some combinatorial logic functions may be implemented using clocked dynamic logic, such as domino logic gates.

Flip-flops or latches typically employed for general-purpose data storage and their ability to store data make sequential and state logic design possible. For example, latches and flip-flops may be used to implement counters or other state machines. Additionally, latches and flip-flops may be used in a datapath design such as, e.g., an adder or multipler, or in the implementation of a memory-type structure such as a register or register file, for example.

Latches may be sensitive to the level of a clock signal, while flip-flops may respond to the edge of the clock signal. Flip-flops may be designed in accordance with various design styles such as, e.g., D-type, set-reset, JK, or toggle, for example. Different styles of flip-flops with different characteristics, such as, e.g., data setup time and clock-to-output time, may be employed in a digital logic design in order to meet design goals.

SUMMARY OF THE EMBODIMENTS

Various embodiments of a logic path are disclosed. Broadly speaking, a circuit and a method are contemplated in which, a storage circuit receives data from a logic circuit and stores the received data responsive to a clock signal. A comparison circuit may compare the received data and data previously stored in the storage circuit. The clock signal may be de-activated by a clock gating circuit responsive to the comparison performed by the comparison circuit.

In one embodiment, the storage circuit includes one or more flip-flop circuits. In a further embodiment, the comparison circuit may be configured to determine if the received data and the previously stored data have the same logical value.

In another embodiment, the clock gating circuit may set the clock signal to an inactive state in response to the determination that the received data and the previously stored data have the same logical value.

BRIEF DESCRIPTION OF THE DRAWINGS

The following detailed description makes reference to the accompanying drawings, which are now briefly described.

Figure 1:
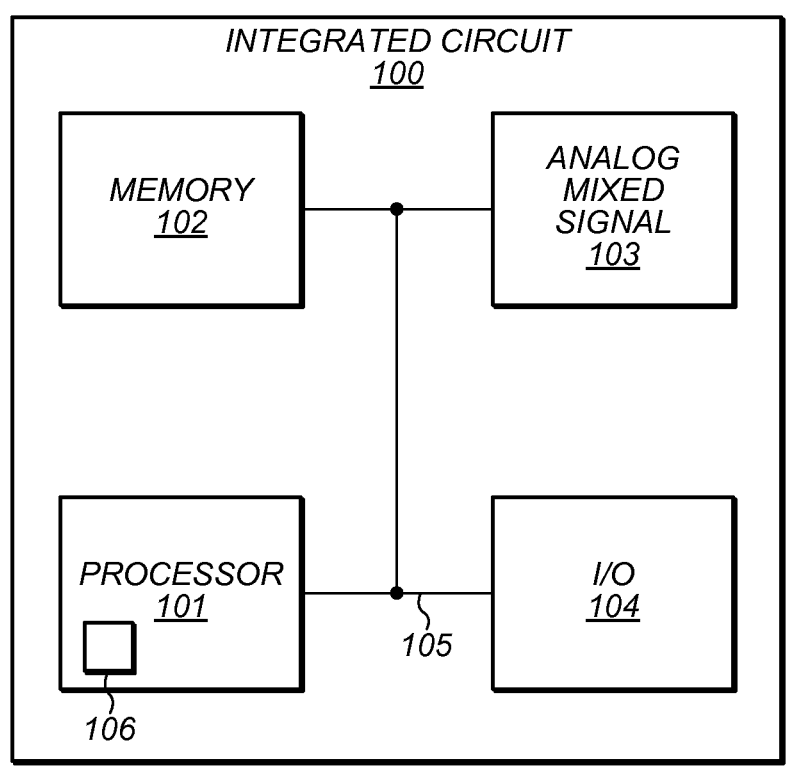
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

An integrated circuit may include one or more functional blocks, such as, e.g., a microcontroller or a processor, which may employ latches or flip-flops to store data or state information. Overall performance of a processor may depend on the particular implementation of flip-flop employed in the design. In some processor implementations, dynamic flip-flops may be employed to improve certain performance parameters, such as, e.g., data setup time. However, in other processor implementations, power or noise requirements, may limit the use of dynamic flip-flops may. When implementing some digital circuits, digital circuit designers must often trade one performance metric for another to achieve design goals. The embodiments illustrated in the drawings and described below may provide techniques for reducing power consumption and data setup time for a flip-flop.

System-On-A-Chip Overview

A block diagram of an integrated circuit is illustrated in FIG. 1. In the illustrated embodiment, the integrated circuit 100 includes a processor 101 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processing device 101 may include one or flip-flops 106, which may be configured to assist in the performance of various functions within processor 101 such as, pipelining, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a FLASH memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Processor Overview

Figure 2:
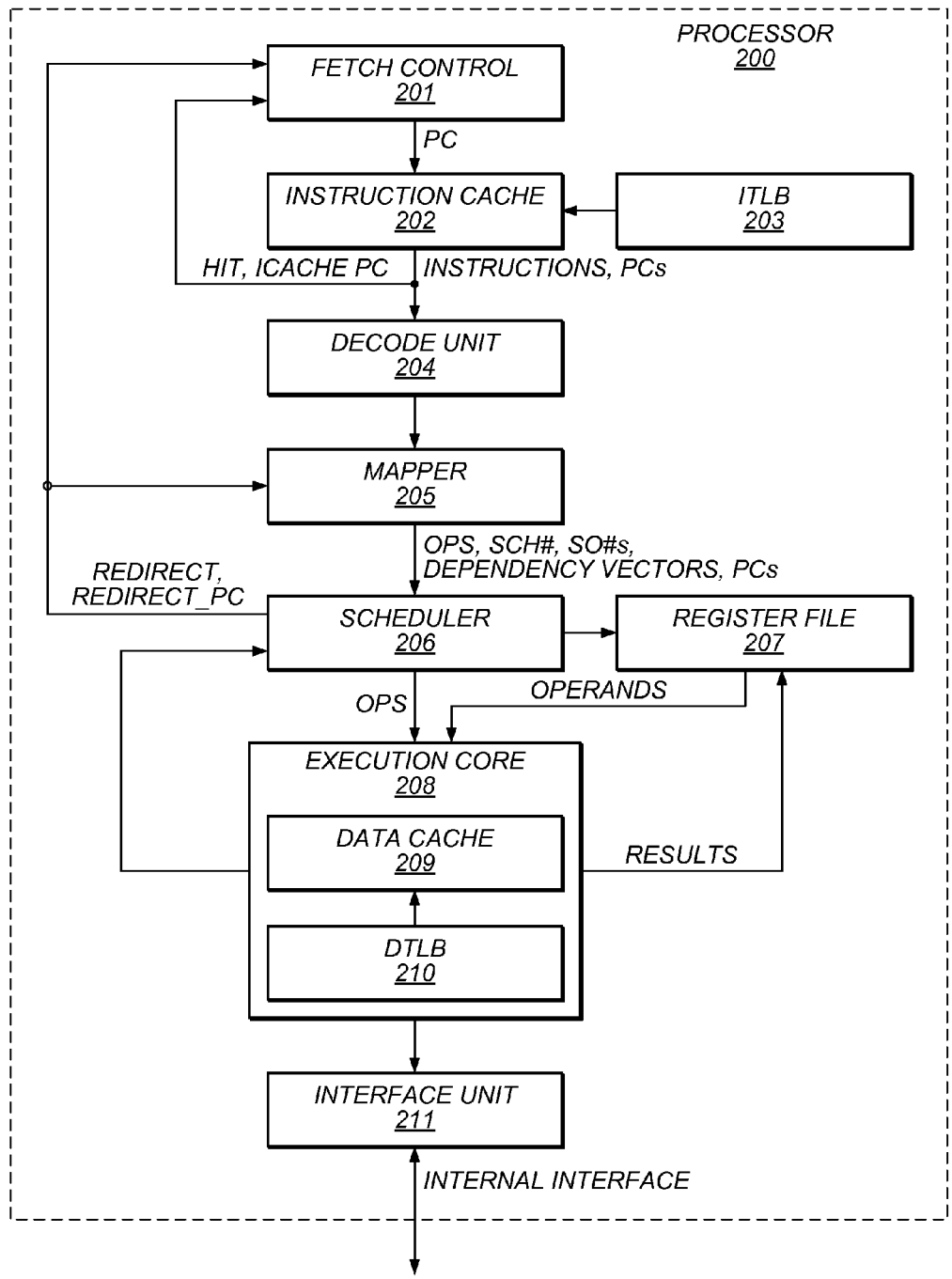
FIG. 2 illustrates an embodiment of a processor that may include one or more flip-flops.

Turning now to FIG. 2, a block diagram of an embodiment of a processor 200 is shown. Processor 200 may, in some embodiments, corresponds to processor 101 of SoC 100 as illustrated in FIG. 1. In the illustrated embodiment, the processor 200 includes a fetch control unit 201, an instruction cache 202, a decode unit 204, a mapper 209, a scheduler 206, a register file 207, an execution core 208, and an interface unit 211. The fetch control unit 201 is coupled to provide a program counter address (PC) for fetching from the instruction cache 202. The instruction cache 202 is coupled to provide instructions (with PCs) to the decode unit 204, which is coupled to provide decoded instruction operations (ops, again with PCs) to the mapper 205. The instruction cache 202 is further configured to provide a hit indication and an ICache PC to the fetch control unit 201. The mapper 205 is coupled to provide ops, a scheduler number (SCH#), source operand numbers (SO#s), one or more dependency vectors, and PCs to the scheduler 206. The scheduler 206 is coupled to receive replay, mispredict, and exception indications from the execution core 208, is coupled to provide a redirect indication and redirect PC to the fetch control unit 201 and the mapper 205, is coupled to the register file 207, and is coupled to provide ops for execution to the execution core 208. The register file is coupled to provide operands to the execution core 208, and is coupled to receive results to be written to the register file 207 from the execution core 208. The execution core 208 is coupled to the interface unit 211, which is further coupled to an external interface of the processor 200.

Fetch control unit 201 may be configured to generate fetch PCs for instruction cache 202. In some embodiments, fetch control unit 201 may include one or more types of branch predictors 212. For example, fetch control unit 202 may include indirect branch target predictors configured to predict the target address for indirect branch instructions, conditional branch predictors configured to predict the outcome of conditional branches, and/or any other suitable type of branch predictor. During operation, fetch control unit 201 may generate a fetch PC based on the output of a selected branch predictor. If the prediction later turns out to be incorrect, fetch control unit 201 may be redirected to fetch from a different address. When generating a fetch PC, in the absence of a nonsequential branch target (i.e., a branch or other redirection to a nonsequential address, whether speculative or non-speculative), fetch control unit 201 may generate a fetch PC as a sequential function of a current PC value. For example, depending on how many bytes are fetched from instruction cache 202 at a given time, fetch control unit 201 may generate a sequential fetch PC by adding a known offset to a current PC value.

The instruction cache 202 may be a cache memory for storing instructions to be executed by the processor 200. The instruction cache 202 may have any capacity and construction (e.g. direct mapped, set associative, fully associative, etc.). The instruction cache 202 may have any cache line size. For example, 64 byte cache lines may be implemented in an embodiment. Other embodiments may use larger or smaller cache line sizes. In response to a given PC from the fetch control unit 201, the instruction cache 202 may output up to a maximum number of instructions. It is contemplated that processor 200 may implement any suitable instruction set architecture (ISA), such as, e.g., the ARM™, PowerPC™, or x86 ISAs, or combinations thereof.

In some embodiments, processor 200 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, the instruction cache 14 may be partially or completely addressed using physical address bits rather than virtual address bits. For example, instruction cache 202 may use virtual address bits for cache indexing and physical address bits for cache tags.

In order to avoid the cost of performing a full memory translation when performing a cache access, processor 200 may store a set of recent and/or frequently-used virtual-to-physical address translations in a translation lookaside buffer (TLB), such as Instruction TLB (ITLB) 203. During operation, ITLB 203 (which may be implemented as a cache, as a content addressable memory (CAM), or using any other suitable circuit structure) may receive virtual address information and determine whether a valid translation is present. If so, ITLB 203 may provide the corresponding physical address bits to instruction cache 202. If not, ITLB 203 may cause the translation to be determined, for example by raising a virtual memory exception.

The decode unit 204 may generally be configured to decode the instructions into instruction operations (ops). Generally, an instruction operation may be an operation that the hardware included in the execution core 208 is capable of executing. Each instruction may translate to one or more instruction operations which, when executed, result in the operation(s) defined for that instruction being performed according to the instruction set architecture implemented by the processor 200. In some embodiments, each instruction may decode into a single instruction operation. The decode unit 16 may be configured to identify the type of instruction, source operands, etc., and the decoded instruction operation may include the instruction along with some of the decode information. In other embodiments in which each instruction translates to a single op, each op may simply be the corresponding instruction or a portion thereof (e.g. the opcode field or fields of the instruction). In some embodiments in which there is a one-to-one correspondence between instructions and ops, the decode unit 204 and mapper 205 may be combined and/or the decode and mapping operations may occur in one clock cycle. In other embodiments, some instructions may decode into multiple instruction operations.

In some embodiments, the decode unit 16 may include any combination of circuitry and/or microcoding in order to generate ops for instructions. For example, relatively simple op generations (e.g. one or two ops per instruction) may be handled in hardware while more extensive op generations (e.g. more than three ops for an instruction) may be handled in microcode.

Ops generated by the decode unit 204 may be provided to the mapper 205. The mapper 205 may implement register renaming to map source register addresses from the ops to the source operand numbers (SO#s) identifying the renamed source registers. Additionally, the mapper 205 may be configured to assign a scheduler entry to store each op, identified by the SCH#. In an embodiment, the SCH# may also be configured to identify the rename register assigned to the destination of the op. In other embodiments, the mapper 205 may be configured to assign a separate destination register number. Additionally, the mapper 205 may be configured to generate dependency vectors for the op. The dependency vectors may identify the ops on which a given op is dependent. In an embodiment, dependencies are indicated by the SCH# of the corresponding ops, and the dependency vector bit positions may correspond to SCH#s. In other embodiments, dependencies may be recorded based on register numbers and the dependency vector bit positions may correspond to the register numbers.

The mapper 205 may provide the ops, along with SCH#, SO#s, PCs, and dependency vectors for each op to the scheduler 206. The scheduler 206 may be configured to store the ops in the scheduler entries identified by the respective SCH#s, along with the SO#s and PCs. The scheduler may be configured to store the dependency vectors in dependency arrays that evaluate which ops are eligible for scheduling. The scheduler 206 may be configured to schedule the ops for execution in the execution core 208. When an op is scheduled, the scheduler 206 may be configured to read its source operands from the register file 207 and the source operands may be provided to the execution core 208. The execution core 208 may be configured to return the results of ops that update registers to the register file 207. In some cases, the execution core 208 may forward a result that is to be written to the register file 207 in place of the value read from the register file 207 (e.g. in the case of back to back scheduling of dependent ops).

The execution core 208 may also be configured to detect various events during execution of ops that may be reported to the scheduler. Branch ops may be mispredicted, and some load/store ops may be replayed (e.g. for address-based conflicts of data being written/read). Various exceptions may be detected (e.g. protection exceptions for memory accesses or for privileged instructions being executed in non-privileged mode, exceptions for no address translation, etc.). The exceptions may cause a corresponding exception handling routine to be executed.

The execution core 208 may be configured to execute predicted branch ops, and may receive the predicted target address that was originally provided to the fetch control unit 201. The execution core 208 may be configured to calculate the target address from the operands of the branch op, and to compare the calculated target address to the predicted target address to detect correct prediction or misprediction. The execution core 208 may also evaluate any other prediction made with respect to the branch op, such as a prediction of the branch op's direction. If a misprediction is detected, execution core 208 may signal that fetch control unit 201 should be redirected to the correct fetch target. Other units, such as the scheduler 206, the mapper 205, and the decode unit 204 may flush pending ops/instructions from the speculative instruction stream that are subsequent to or dependent upon the mispredicted branch.

The execution core may include a data cache 209, which may be a cache memory for storing data to be processed by the processor 200. Like the instruction cache 202, the data cache 209 may have any suitable capacity, construction, or line size (e.g. direct mapped, set associative, fully associative, etc.). Moreover, the data cache 209 may differ from the instruction cache 202 in any of these details. As with instruction cache 202, in some embodiments, data cache 26 may be partially or entirely addressed using physical address bits. Correspondingly, a data TLB (DTLB) 210 may be provided to cache virtual-to-physical address translations for use in accessing the data cache 209 in a manner similar to that described above with respect to ITLB 203. It is noted that although ITLB 203 and DTLB 210 may perform similar functions, in various embodiments they may be implemented differently. For example, they may store different numbers of translations and/or different translation information.

The register file 207 may generally include any set of registers usable to store operands and results of ops executed in the processor 200. In some embodiments, the register file 207 may include a set of physical registers and the mapper 205 may be configured to map the logical registers to the physical registers. The logical registers may include both architected registers specified by the instruction set architecture implemented by the processor 200 and temporary registers that may be used as destinations of ops for temporary results (and sources of subsequent ops as well). In other embodiments, the register file 207 may include an architected register set containing the committed state of the logical registers and a speculative register set containing speculative register state.

The interface unit 211 may generally include the circuitry for interfacing the processor 200 to other devices on the external interface. The external interface may include any type of interconnect (e.g. bus, packet, etc.). The external interface may be an on-chip interconnect, if the processor 200 is integrated with one or more other components (e.g. a system on a chip configuration). The external interface may be on off-chip interconnect to external circuitry, if the processor 200 is not integrated with other components. In various embodiments, the processor 200 may implement any instruction set architecture.

It is noted that the embodiment of a processing device illustrated in FIG. 2 is merely an example. In other embodiments, different functional block or configurations of functional blocks are possible and contemplated.

Logic Paths and Flip-Flop Design

Figure 3:
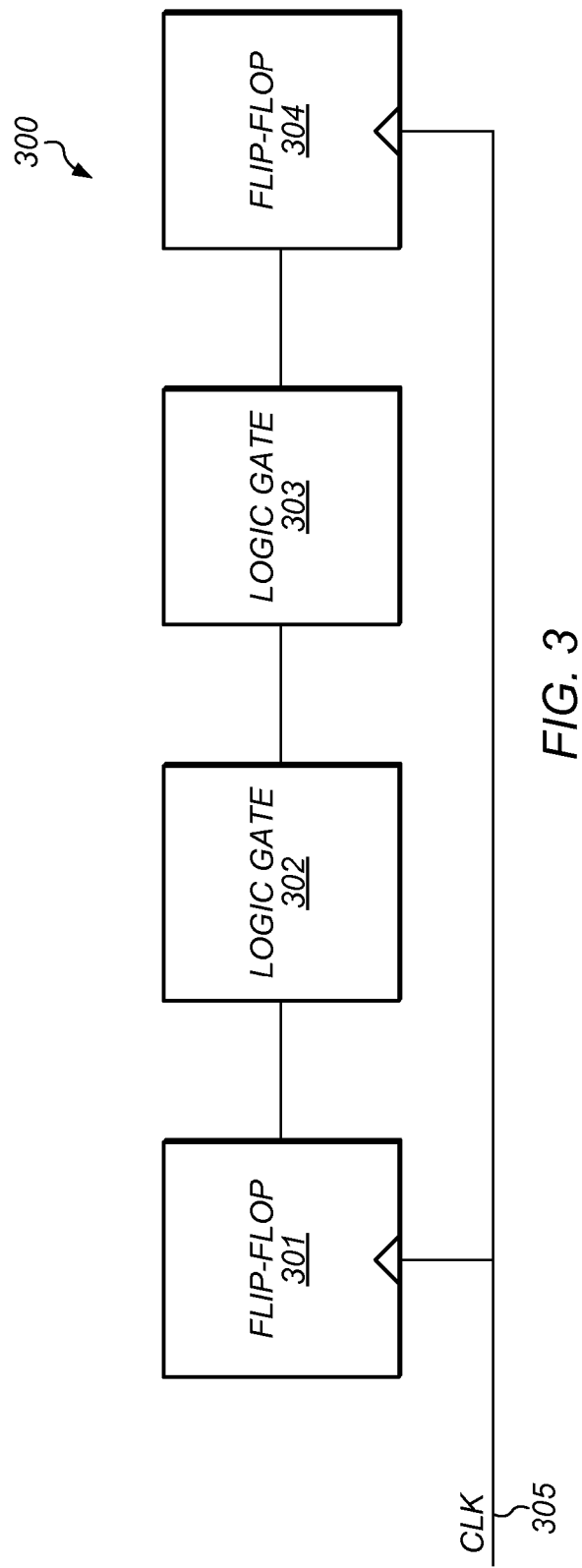
FIG. 3 illustrates an embodiment of a logic path that may include one or more flip-flops.

An example of a portion of a logic path is illustrated in FIG. 3. In the illustrated embodiment, flip-flop 301 is coupled to logic gate 302, which is in turn, coupled to logic gate 303. Logic gate 303 is coupled to another flip-flop 304. The illustrated embodiment also includes a clock input 305 denoted as "CLK." Generally speaking, flip-flops 301 and 304 may correspond to any suitable state element, such as a static or dynamic flip-flop. Flip-flops 301 and 304 may operate to capture and store input data in response to clock input 305. For example, flip-flops 301 and 304 may be an edge-triggered state element.

Logic gates 302 and 303 may be configured to implement combinatorial logic functions of any suitable type (e.g., AND, OR, NAND, NOR, XOR, and XNOR, or any suitable Boolean expression). Either of logic gates 302 or 303 may be implemented using static or dynamic logic. For example, if implemented using dynamic logic, logic gates 302 and 303 may also be clocked by clock input 305, or they may be clocked by a clock signal (not shown) that is derived from clock input 305. It is noted that the number of logic gates and connectivity shown in FIG. 3 are merely an illustrative example, and that in other embodiments, other numbers and configurations of gates and state elements may be employed.

The logic path illustrated in FIG. 3 may correspond to any of numerous different types of digital logic circuits, and may generally include any series of gates bounded by state elements. For example, the logic path may correspond to a portion of a datapath within a processing device, such as processing device 200 as described above with respect to FIG. 2. The datapath may be a portion of an adder, shifter, multiplier, divider, buffer, register file, other any other type of circuit or functional unit that operates to store or operate on data during the course of instruction execution. The logic path may also correspond to control paths within a processor that generate signals that control the operation of datapath or other elements within the processor. It is noted, however, that other configurations of logic paths are possible and contemplated.

Figure 8:
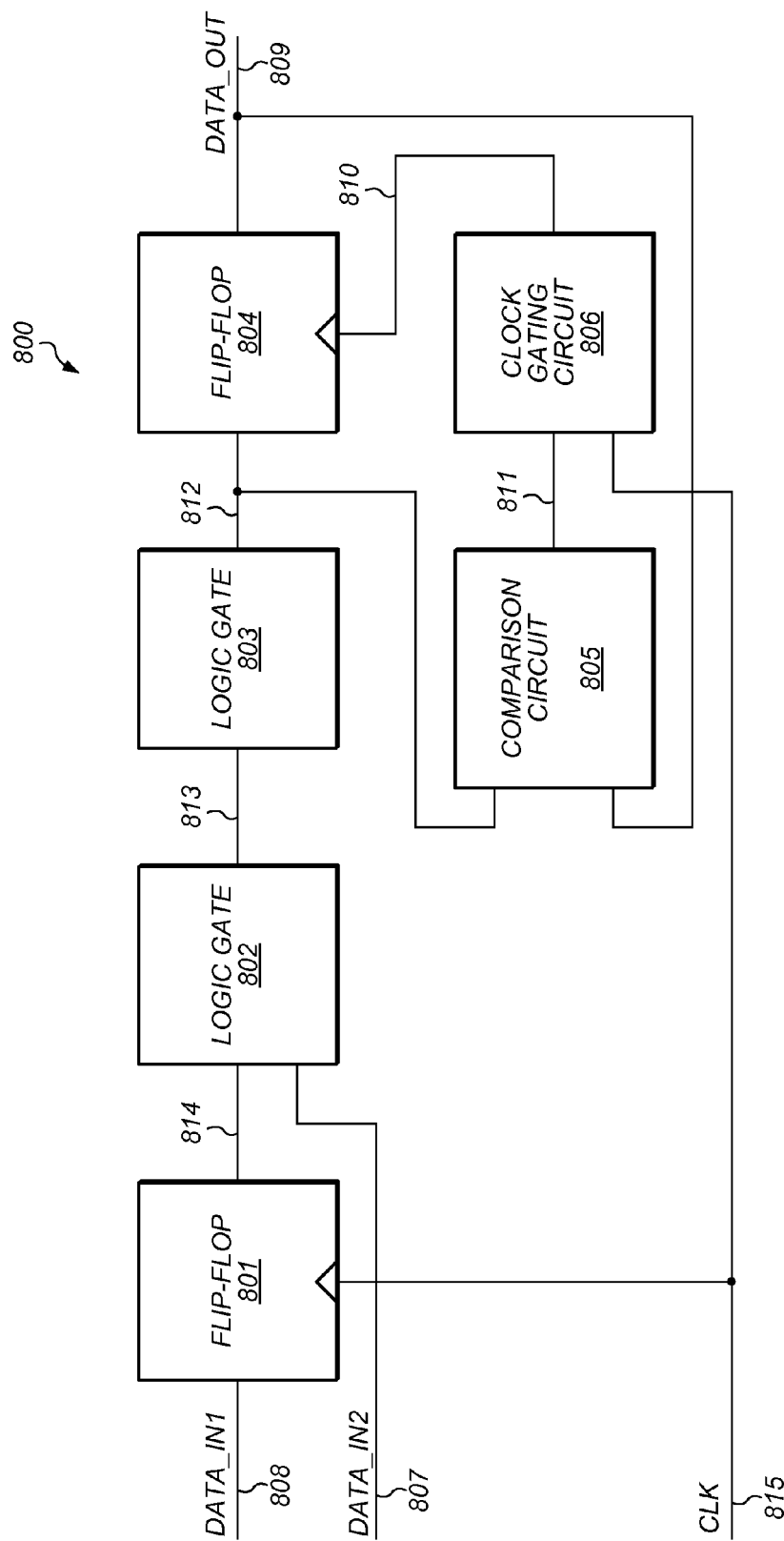
FIG. 8 illustrates another embodiment of a logic path.

Another embodiment of a logic path is illustrated in FIG. 8. The embodiment illustrated in FIG. 8 may, in some embodiments, be employed in one of the various functional blocks of processor 200 as illustrated in FIG. 2. In the illustrated embodiment, logic path 800 includes clock input 815 denoted as "CLK," first data input 808 denoted as "DATA_IN1," second data input 807 denoted as "DATA_IN2," and data output 809 denoted as "DATA_OUT."

First data input 808 is coupled to flip-flop 801, and is controlled by clock input 806. The output of flip-flop 801 is coupled to node 814, which is, in turn, coupled to an input of logic gate 802. Another input of logic gate 802 is coupled to second data input 807. In some embodiments, second data input 807 may originate in a different functional block, such as, e.g., decode unit 204 of processor 200 as illustrated in FIG. 2. Second data input 807 may, in other embodiments, be the output of another flip-flop included in a different logic path.

The output of logic gate 802 is coupled to node 813, which is, in turn, coupled to the input of logic gate 803. The output of logic gate 802 is coupled to node 812. In some embodiments, logic gates 802 and 803, may be configured to implement combinatorial logic functions of any suitable type (e.g., AND, OR, NAND, NOR, XOR, and XNOR, or any suitable Boolean expression). Either of logic gates 802 or 803 may be implemented using static or dynamic logic. In other embodiments, logic gates 802 and 803 may be implemented using one or more basic logic circuits from a library of available circuits (commonly referred to as a "standard cell library"). Logic gates 802 and 803 may, in other embodiments, be implemented as full-custom circuit designs.

Node 812 is coupled to the input of flip-flop 804, and an input of comparison circuit 805. Another input of comparison circuit 805 is coupled to data output 809 which is further coupled to the output of flip-flop 804. The output of comparison circuit 804 is coupled to node 811 which is further coupled to an input of clock gating circuit 806. Another input of clock gating circuit 806 is coupled to clock input 815. The output of clock gating circuit 806 is coupled to local clock 810 which controls flip-flop 804.

Flip-flop 804 and flip-flop 801 may be designed in accordance with one of varying design styles. In some embodiments, flip-flop 801 and flip-flop 804 may be implemented with static logic gates. Flip-flop 801 and flip-flop 804 may, in other embodiments, be implemented using dynamic logic circuits. Both flip-flops 801 and 804 may be triggered off of either the rising or falling edge of their respective clock signals. In some embodiments, flip-flop 801 and flip-flop 804 may be implemented as one or more latch circuits.

Comparison circuit 805 may, in some embodiments, be configured to compare the logical value on node 812 to the logical value on data output 809. One or more exclusive-OR (XOR) gates may be included to perform a bitwise comparison of the data bits included on node 812 and data output 809.

Clock gating circuit 806 may, in some embodiments, be configured to generate local clock 810. In some embodiments, local clock 810 may be a buffered version of clock input 815. Clock input 815 may, in various embodiments, be an output from a clock tree or any suitable clock distribution network. The output of comparison circuit 805 may be used, in other embodiments, to de-activate local clock 810. In various embodiments, the de-activated local clock 810 may remain at a logic high or logic low level for one or more cycles of clock input 815. Clock gating circuit 806 may, in other embodiments, be configured to synchronize rising and falling edges of local clock 810 with rising and falling edges of clock input 815. In some embodiments, synchronizing the clock edges of a local clock may prevent duty cycle distortion for portions of a logic path.

Although logic path 800 depicts only one comparison circuit and one clock gating circuit, in other embodiments, each flip-flop within a logic path may have a corresponding comparison circuit and clock gating circuit. In other embodiments, a local clock generated by a clock gating circuit may be employed to clock more than one flip-flop.

Figure 4:
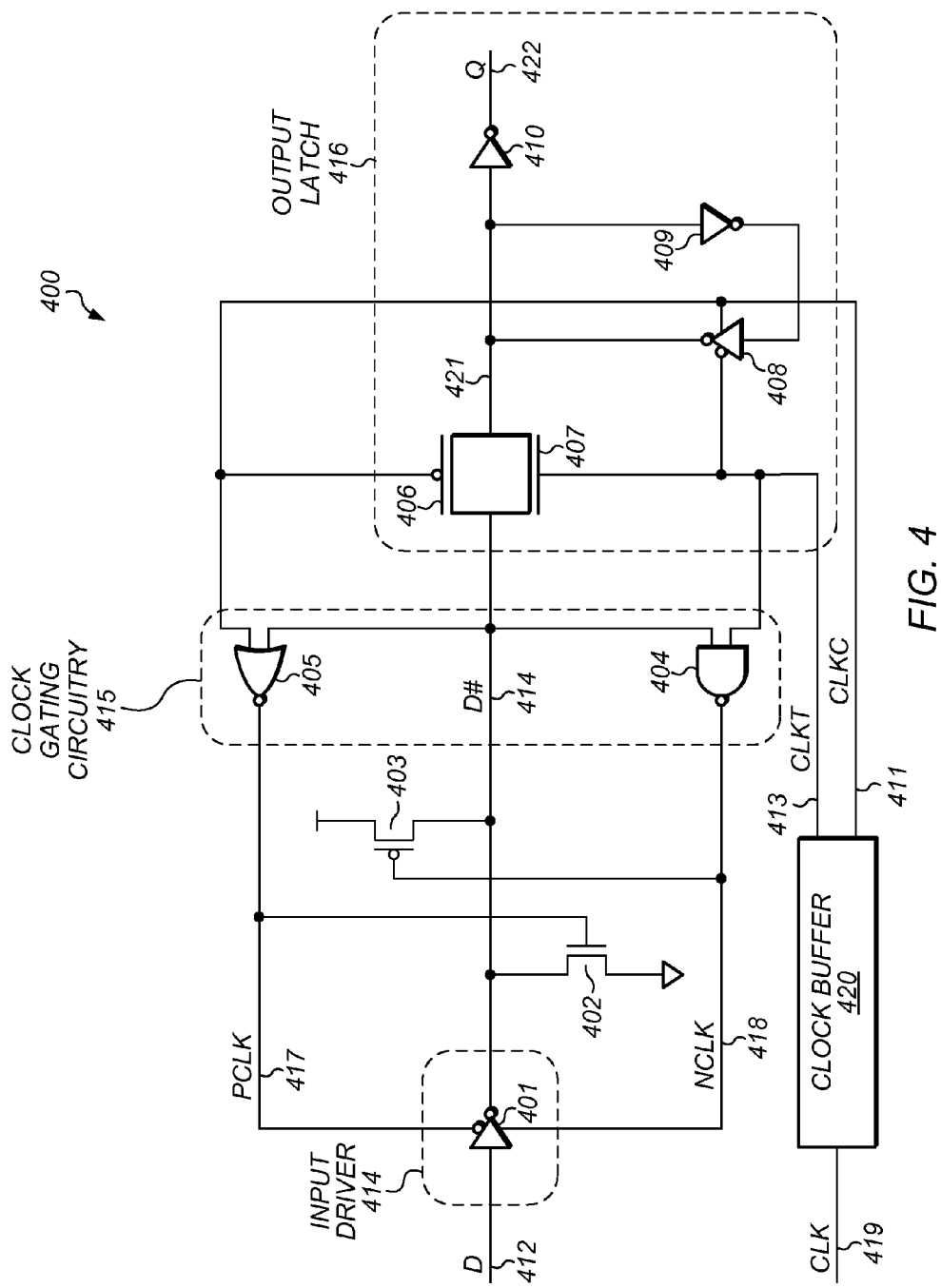
FIG. 4 illustrates an embodiment of a flip-flop.

Turning to FIG. 4, a flip-flop is illustrated according to one of several possible embodiments. In some embodiments, flip-flop 400 may correspond to flip-flop 106 embedded within processor 101. The illustrated embodiment includes clock input 419 denoted as "clk," data input 412 denoted as "D," and data output 422 denoted as "Q."

In the illustrated embodiment, clock input 419 is coupled to clock buffer 420, which may be configured to generate true clock 413 denoted as "clkt" and complement clock 411 denoted as "clkc." In some embodiments, clock buffer 418 may include one or more inverters, non-inverting buffers, or any other circuit suitable for clock generation.

Input data 412 is coupled to controllable inverter 401 of input receiver 414, whose output is coupled to complement data 414 denoted as "d#." Complement data 414 is further coupled to NOR gate 405 and NAND gate 404 of clock gating circuitry 415. NOR gate 405 is further coupled to complement clock 411, and NAND gate 404 is further coupled to true clock 413. The outputs of NOR gate 405 and NAND gate 404 are coupled to internal clock 417 denoted as "PCLK," and internal clock 418 denoted as "NCLK," respectively. While NOR and NAND gates are depicted in the embodiment of clock gating circuit 415 illustrated in FIG. 4, other types and configurations of logic gates may be employed in other embodiments.

An inverter such as, inverter 401, for example, having one or more control inputs may also be referred to as a herein as a "clocked inverter" or a "controllable inverter," although it is noted that the signals that drive the control inputs need not be clock signals, but may be any sort of control signal. In the illustrated embodiment, one control input of inverter 401 is coupled to internal clock 417, and another control input of inverter 401 is coupled to internal clock 418. The operation of a clocked inverter will be described in more detail below in reference to FIG. 5.

Pull-up device 403 is coupled to complement data 414 and is controlled by internal clock 418. Pull-down device 402 is also coupled to complement data 414 and is controlled by internal clock 417. Although illustrated as single devices, pull-down device 402 and pull-up device 403 may each be implemented as a plurality of series devices with common control connections to reduce the transconductance of the devices. In some embodiments, pull-down device 402 may include an n-channel metal-oxide-semiconductor field-effect transistor (MOSFET), and pull-up device 403 may include a p-channel MOSFET. It is noted that, in various embodiments, a "transistor" may correspond to one or more transconductance elements such as a junction field-effect transistor (JFET), for example.

Complement data 414 is further coupled to pass-devices 406 and 407 of output latch 416. Pass devices 406 and 407 are further coupled to storage node 421, and are controlled by complement clock 411 and true clock 413, respectively. Pass-devices configured in such a manner are commonly referred to as a "pass-gate" or "transmission-gate." In some embodiments, pass-device 406 may include a p-channel MOSFET, and pass-device 407 may include an n-channel MOSFET.

Storage node 421 of output latch 416 is further coupled to the input of inverter 410, the input of inverter 409, and the output of controllable inverter 408. The output of inverter 410 is further coupled to data output 422. The output of inverter 409 is coupled to the input of controllable inverter 408, which is controlled by internal clock 413 and internal clock 411. Inverter 409 and controllable inverter 408 form a feedback path that may allow for a logical state to be stored on storage node 421. Although the embodiment of output latch 416 illustrated in FIG. 4, employs feedback inverters (inverter 409 and controllable inverter 408), and a pass-gate (pass-devices 406 and 407), in other embodiments, different circuit elements and logic gates may be employed to implement the output latch 416.

It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

During operation, as will be described in more detail in reference to FIG. 6 and FIG. 7, the logic level on complement data 414 may be coupled to storage node 412 through pass-devices 406 and 407 when input clock 419 is high (the high logic level on input clock 419 results in clock buffer 420 setting internal clock 413 to a high logic level and internal clock 411 to a low logic level). Moreover, controllable inverter 408 is disabled, allowing for previously stored data to be over-written. When new data may be stored in a latch circuit, the latch is commonly referred to as being in "transparent mode."The logic polarity of the logic level storage on storage node 421 may be inverted and output through inverter 410.

While input clock 419 is high, the state of internal clocks 417 and 418 is dependent upon the logic level on complement data 414. For example, if a high logic level exists on complement data 414, internal clocks 418 and 417 may both be set to a low logic level, thereby enabling pull-up device 403 and, as will be described in more detail below in reference to FIG. 5, the pull-up path of controllable inverter 401. Pull-up device 403 maintains the high logic level on complement data 414, and since the pull-down path of controllable inverter 401 is disabled, a high logic level on input data 412 cannot change the logic level on complement data 414. A similar situation may occur, with different logic levels, when a low logic level is present on complement data 414 while input clock 419 is high.

When input clock 419 transitions to a low logic level, clock buffer 420 sets true clock 413 to a low logic level, and complement clock 411 to a high logic level. The new logic levels of true clock 413 and complement clock 411 disable pass-device 406 and 407, and activate controllable inverter 408, thereby allowing the logic state on storage node 421 to be maintained. When a latch is storing data, it is commonly referred to as being in "latched mode" or as being "opaque."

In response to the transition of input clock 419 to a low logic level, internal clock 418 transitions to a high logic level, and internal clock 417 transitions to a low logic level, irrespective of the logic level on complement data 414. The new logic levels on internal clocks 417 and 418 disable pull-up device 403 and pull-down device 402, and enable both the pull-up and pull-down paths of controllable inverter 401, thereby allowing the inverted logical polarity of input data 412 to be coupled to complement data 414.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

Although flip-flop 400 may be used within logic paths as illustrated in FIG. 3, they may also be used in any suitable storage application. For example, one or more of flip-flop 400 may be arranged to implement a memory-type structure, such as a register, a register file, a first-in-first-out (FIFO) queue, a last-in-last-out (LIFO) queue, a cache or any suitable arrangement.

Figure 5:
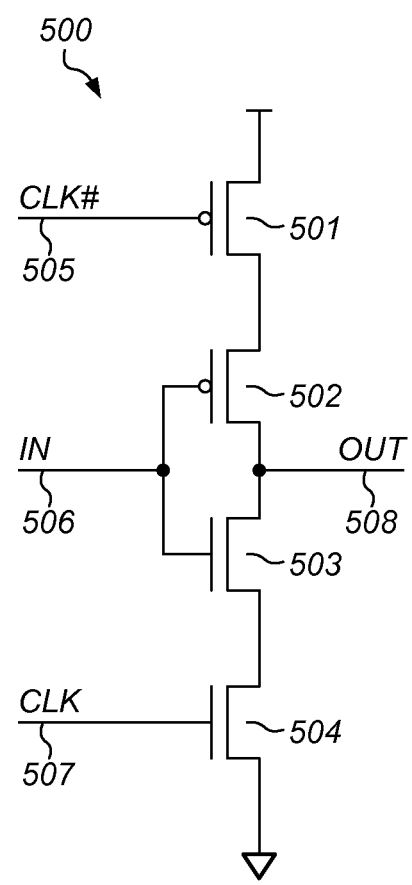
FIG. 5 illustrates an embodiment of a controllable inverter.

An embodiment of a controllable inverter is illustrated in FIG. 5. The illustrated embodiment includes a clock input 507 denoted as "clk," a complement clock input 505 denoted as "clk#," a data input 506 denoted as "in," and a data output 508 denoted as "out." In some embodiments, clock input 507 may correspond to internal clock 418 of flip-flop 400, and complement clock input 505 may correspond to internal clock 417 of flip-flop 400.

In the illustrated embodiment, data input 506 controls pull-up device 502 and pull-down device 503, which are each coupled to data output 508. Pull-up device 502 is further coupled to pull-up device 501, which is controlled by complement clock input 505, forming a pull-up path. Pull-down device 503 is further coupled to pull-down device 504, which is controlled by clock input 507, forming a pull-down path. In various embodiments, pull-up devices 501 and 502 may include p-channel MOSFETs, and pull-down device 503 and 504 may include n-channel MOSFETs. The source connection of p-channel MOSFETs employed as pull-up devices may, in some embodiments, be coupled to a power supply, and the source of n-channel MOSFETs employed as pull-down devices may, in some embodiments, be coupled to ground or a circuit node at or near ground potential.

It is noted that in various embodiments, a pull-up path (also referred to herein as a pull-up network) may include one or more transistors coupled, in a series fashion, parallel fashion, or combination thereof, between a circuit node and a power supply. It is further noted that a pull-down path (also referred to herein as a pull-down network) may include one or more transistors coupled, in a series fashion, parallel fashion, or combination thereof, between a circuit node and ground or a circuit node at or near ground potential.

During operation, when clock input 507 is high and complement clock input 505 is low, pull-down device 504 and pull-up device 501 are both on, thereby allowing pull-up device 502 and pull-down device 503 to function as an inverting amplifier. In this mode of operation, the logical polarity of data presented on data input 506 is inverted on data output 508.

When clock input 507 is low and complement clock input 505 is high, pull-down device 505 and pull-up device 501 are off, thereby preventing any current to flow from the power supply or discharge into ground. In this mode of operation, the impedance of data output 508 is high, which may, in some embodiments, be treated as a third logic state to implement a three state (commonly referred to as "tri-state") logic system.

In some embodiments, clock input 507 and complement clock input 505 may be operated independently allowing for either the pull-up path or the pull-down path of controllable inverter 500 to be active. For example, clock input 507 and complement clock input 508 may both be at a low logic level, disabling pull-down device 504 and enabling pull-up device 501. Data output 508 cannot be discharge to ground since pull-down device 504 is disabled. When input data 506 is at a low logic level, data output 508 may be charged to a high logic level through pull-up devices 501 and 502. Data output 508 may be tri-state when data input 506 is at a high logic level.

It is noted that the embodiment of a controllable inverter illustrated in FIG. 5 is merely an example. In other embodiments, different devices and different configurations of devices are possible and contemplated.

Figure 6:
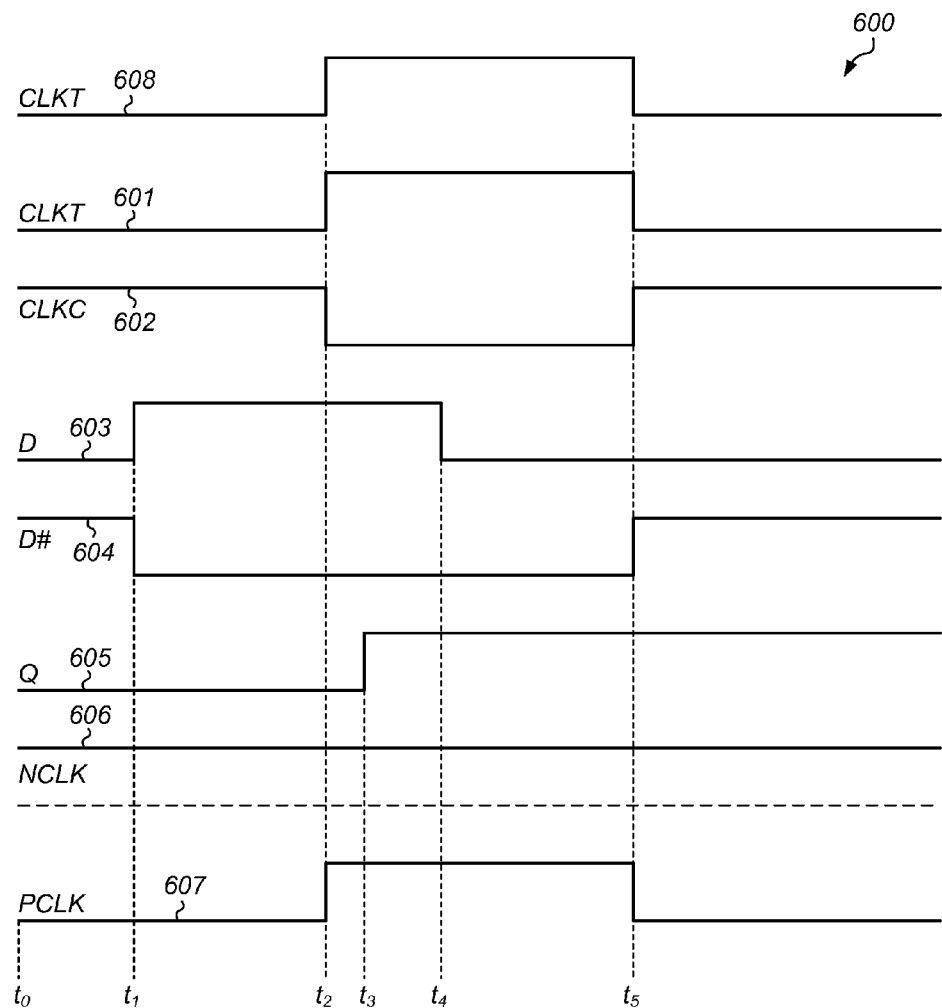
FIG. 6 illustrates possible waveforms for the operation of a flip-flop.

Example waveforms from the operation of a flip-flop are illustrated in FIG. 6. Referring collectively to flip-flop 400 of FIG. 4 and the waveforms of FIG. 6, the waveforms begin at time $t_0$ with input clock 419 at a low logic level (waveform 618), and data output 422 at a low logic level (waveform 605). At time $t_1$, input data 412 transitions to a high logic level (waveform 603), resulting in complement data 414 switching to a low logic state (waveform 604).

Input clock 419 switches to a high logic level at time $t_2$, resulting in true clock 413 (waveform 601) transitioning to a high logic level and complement clock (waveform 602) transitioning to a low logic level. Responsive to the change in logic level of complement clock 411, internal clock 417 (waveform 607) switches to a high logic level. It is noted that in this example, internal clock 418 does not change logic levels due to the polarity of the data on complement data 414.

At time $t_3$, data output 422 (waveform 605) changes state in response to pass-device 406 and 507 becoming active when clock input 419 transitions to a high logic level. The time it takes for the data on complement data 414 to appear at data output 422 after clock input 419 switches to a high logic level (the delay from $t_2$ to $t_3$) is commonly referred to as "clk-to-q."

Data input 412 (waveform 603) transitions to a low logic level at time $t_4$. This change, however, does not result in a change in complement data 414 (waveform 604) as internal clock 417 (waveform 607) is at a high logic level, which may disable the pull-up path of controllable inverter 401.

Input clock 419 (waveform 608) returns to a low logic level at time $t_5$, resulting in true clock 413 (waveform 601) switching to a low logic level, and complement clock 411 (waveform 602) switching to a high logic level. Internal clock 417 (waveform 607) returns to a low logic level in response to the change in logic level of complement clock 411. With internal clock 417 now at a low logic level, the pull-up path of controllable inverter 401 may then be enabled, allowing a transition on complement data 414 (waveform 604).

It is noted that the waveforms illustrated in FIG. 6 are merely an example. In other embodiments, different stimulus may result in different waveforms.

Figure 7:
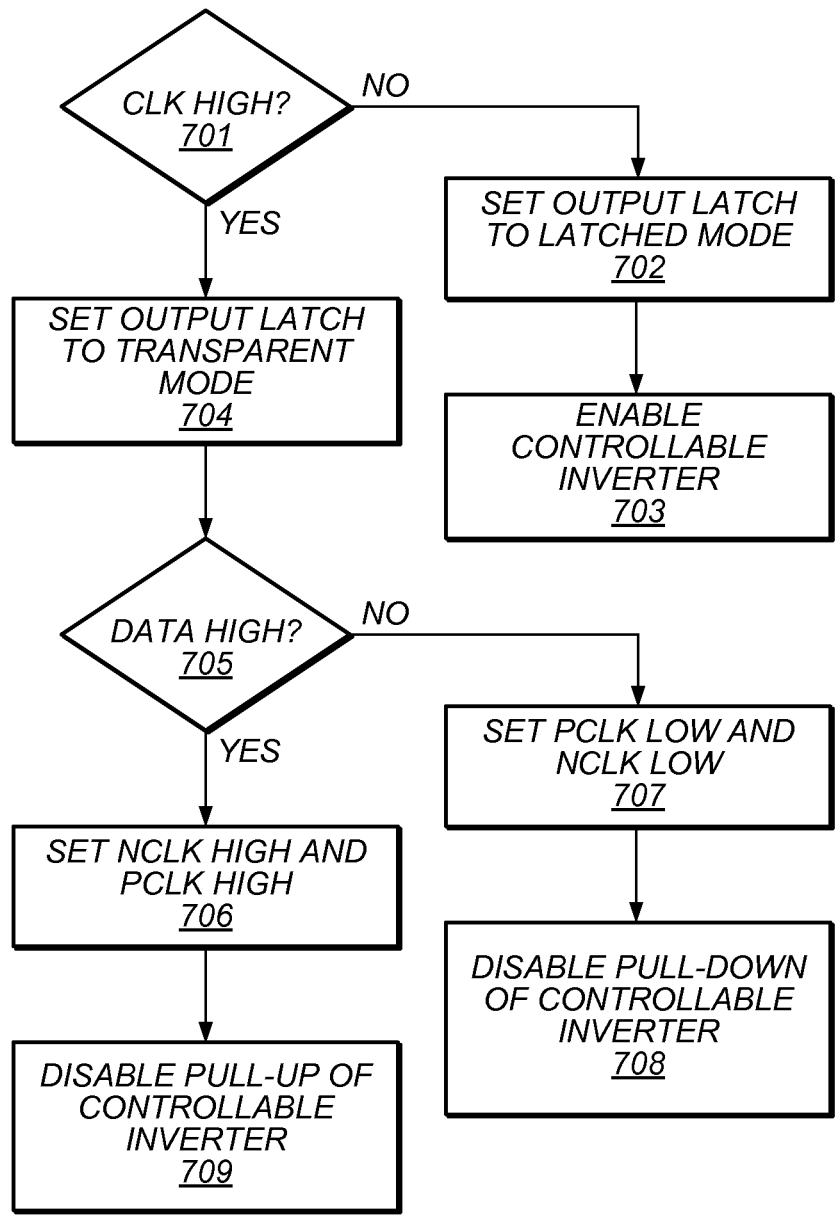
FIG. 7 illustrates a flowchart of an example method for operating a flip-flop.

Turning to FIG. 7, a flowchart depicting a method for operating a flip-flop. Referring collectively to FIG. 4 and the flowchart of FIG. 7, the method initially depends on the state of clock input 413 (block 701). In some embodiments, the operation may depend on both a true and a complement clock input.

When input clock 419 is at a low logic level, true clock 413 may be at a low logic level, and complement clock 411 may be at a high logic level, thereby setting output latch 416 to latched mode (block 702). Furthermore, the aforementioned logic levels on true clock 413 and complement clock 411, may result in internal clock 417 being at a low logic level, and internal clock 418 being at a high logic level, which may activate both the pull-up and pull-down path of controllable inverter 401 (block 703).

When input clock 419 is at a high logic level, true clock 413 may be at a high logic level, and complement clock 411 may be at a low logic level, thereby setting output latch 416 to transparent mode (block 704). The method of operation is then dependent upon the logic level of input data 412 (block 705).

A high logic level on input data 412 in conjunction with a high logic level on input clock 419 may result in a high logic level on both internal clocks 417 and 418 (block 706), which may result in the pull-up path of controllable inverter 401 being disabled (block 709). When input data 412 is at a low logic level, complement data 414 may be at a high logic level, in conjunction with the high logic level on input clock 419, may result in internal clocks 417 and 418 being at a low logic level (block 707), may result in the pull-down path of controllable inverter 401 being disabled (block 708).

The operations depicted in the method illustrated in FIG. 7 are shown as being performed in a sequential manner. In other embodiments, some or all of the steps may be performed in parallel.

Figure 9:
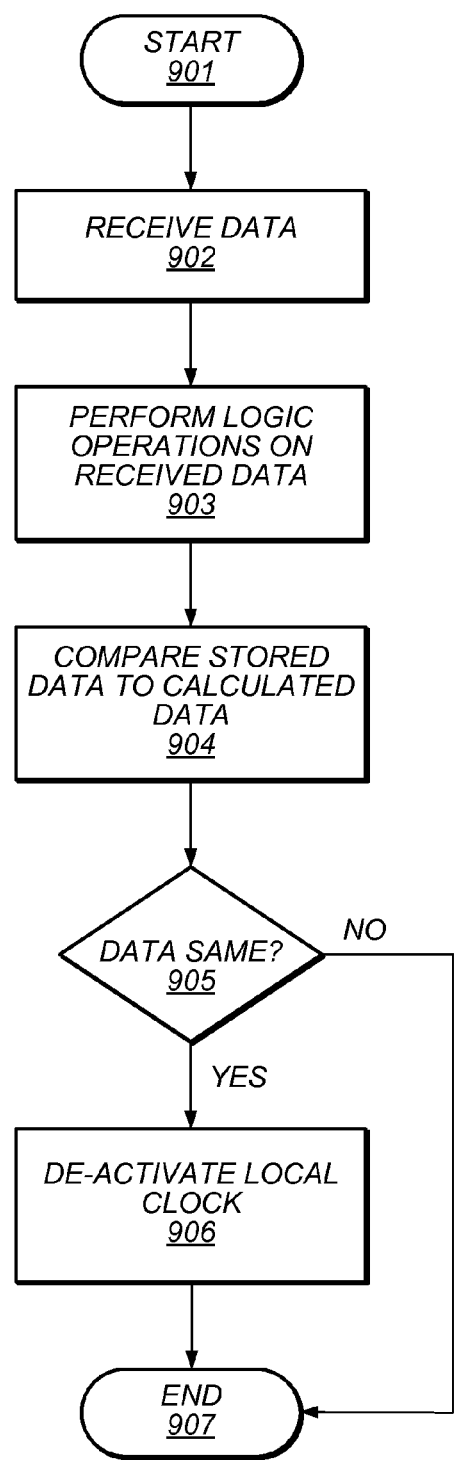
FIG. 9 illustrates a flowchart of an example method for operating a logic path.

An embodiment of a method for operating a logic path, such as, e.g., logic path 800 as depicted in FIG. 8, is illustrated in FIG. 9. The logic path may, in various embodiments, be included in a function block of a processor, such as processor

200 as illustrated in FIG. 2, for example. The method begins in block 901. Data may then be received by the logic path (block 901). In some embodiments, the data may be received from another functional block, such as, e.g., decoder unit 204 of processor 200. The received data may, in other embodiments, originate from a different logic path within a same functional block. The logic path may, in various embodiments, be configured to operate on data words of any suitable bit width, and the received data may include multiple data bits or words.

Once the data has been received, logic operations may be performed on the data (block 903). The logic operations may include, without limitation, OR, AND, or NOT, or any suitable combination thereof. In some embodiments, operands used to perform the logic operations may include an output of a flip-flop or other storage element included in the logic path, such as, node 814 as depicted in FIG. 8, for example.

After the completion of any logic operations, previously stored data may then be compared to the result of the logic operation (block 904). In some embodiments, the operation may be performed by a comparison circuit, such as comparison circuit 805 of logic path 800 as illustrated in FIG. 8. In cases where the logic path is configured to operation on a data word containing more than one data bit, the comparison circuit may perform a bitwise comparison, and the results of the bitwise comparison may be combined to form a comparison signal. In other embodiments, an analog voltage comparator may be employed to perform the comparison.

The method may then depend on the results of the comparison (block 905). In some embodiments, when the previously stored data does not match result of any logic operations, a local clock, such as, local clock 810, may continue to operate and the method may conclude (block 907). When the previously stored data has the same logical value (i.e., each data bit position of the two words of data contains the same logic level), the local clock may be de-activated (block 906). The de-activated state of the local clock may be a high logic level while, in other embodiments, the de-activated state of the local clock may be a low logic level. In some embodiments, de-activating the local clock may reduce switching power consumption of the logic path.

It is noted that the method illustrated in FIG. 9 is merely an example. In other embodiments, different operations and different orders of operations are possible and contemplated.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a storage circuit configured to:
receive data from a logic circuit; and
store the received data responsive to a local clock signal;
a comparison circuit configured to compare the received data to data previously stored in the storage circuit; and
a clock gating circuit configured to:
synchronize the local clock signal dependent upon a global clock signal, wherein a duty cycle of the local clock signal is equal to a duty cycle of the global clock signal; and
deactivate the local clock signal dependent upon the comparison.

2. The apparatus of claim 1, wherein the storage circuit comprises one or more flip-flop circuits.

3. The apparatus of claim 1, wherein to compare the received data to the data previously stored in the storage circuit, the comparison circuit is further configured to determine if the received data has the same logical value as the previously stored data.

4. The apparatus of claim 3, wherein to deactivate the local clock signal the clock gating circuit is further configured to set the local clock signal to an inactive state responsive to the determination that the received data has the same logical value and the previously stored data.

5. The apparatus of claim 1, wherein the logic circuit is configured to generate the received data dependent upon data from another storage circuit.

6. The apparatus of claim 1, wherein to deactivate the local clock signal, the clock gating circuit is further configured to deactivate the local clock signal dependent upon the global clock signal.

7. A method, comprising:
receiving data from a logic circuit;
generating a local clock signal;
synchronizing the local clock signal dependent upon a global clock signal, wherein a duty cycle of the local clock signal is equal to a duty cycle of the global clock signal;
comparing the received data to previously stored data;
determining if the received data has the same logical value as the previously stored data dependent upon the comparison;
deactivating the local clock signal dependent upon the determination; and
storing the received data responsive to the local clock signal.

8. The method of claim 7, wherein comparing the received data to previously stored data comprises performing at least one exclusive-OR (XOR) operation.

9. The method of claim 7, wherein generating the local clock signal comprises receiving the global clock signal.

10. The method of claim 7, wherein receiving data includes performing one or more logic operations on the received data.

11. The method of claim 7, wherein storing the received data comprises activating, by the local clock, one or more flip-flop circuits.

12. A system, comprising:
a processor; and
one or more memories;
wherein the processor comprises:
a plurality of storage circuits, wherein each storage circuit of the plurality of storage circuits is configured to:
receive data from a given one of a plurality of logic circuits; and
store the received data responsive to a respective one of a plurality of local clock signals;
a plurality of comparison circuits, wherein each comparison circuit of the plurality of comparison circuits is configured to compare the received data from a respective one of the plurality of logic circuits and previously stored data for a respective one of the plurality of storage circuits; and
a plurality of clock gating circuits, wherein each clock gating circuit of the plurality of clock gating circuits is configured to:
generate a respective one of the plurality of local clock signals dependent upon a global clock signal and the comparison of a respective one of the plurality of comparison circuits;
synchronize the respective one of the plurality of local clock signals dependent upon the global clock signal, wherein a duty cycle of the respective one of the plurality of local clocks signals is equal to a duty cycle of the global clock signal.

13. The system of claim 12, wherein each storage circuit of the plurality of storage circuits includes one or more flip-flop circuits.

14. The system of claim 12, wherein to compare the received data from the respective one of the plurality of logic circuits and the previously stored data for a respective one of the plurality of storage circuits, each comparison circuit of the plurality of comparison circuits is further configured to determine if the received data from the respective one of the plurality of logic circuits has the same logical value as the previously stored data for the respective one of the plurality of storage circuits.

15. The system of claim 13, wherein to generate a respective one of the plurality of local clock signals, each clock gating circuit of the plurality of clock gating circuits is further configured to de-active the respective one of the plurality of local clock signals in response to the determination of a respective one of the comparison circuits.

16. The system of claim 12, wherein each comparison circuit of the plurality of comparison circuits comprises one or more exclusive-OR gates.

17. The system of claim 12, wherein each logic circuit of the plurality of logic circuits comprises one or more logic gates.

* * * * *

UNITED STATES PATENT AND TRADEMARK OFFICE
CERTIFICATE OF CORRECTION

| | |
|---|---|
| PATENT NO. | : 8,860,484 B2 |
| APPLICATION NO. | : 13/838212 |
| DATED | : October 14, 2014 |
| INVENTOR(S) | : Pham et al. |

It is certified that error appears in the above-identified patent and that said Letters Patent is hereby corrected as shown below:

In the Specification

In column 1, line 27, delete "multipler," and insert -- multiplier, --, therefor.

Signed and Sealed this
Fifth Day of May, 2015

Michelle K. Lee
*Director of the United States Patent and Trademark Office*